US011848159B2

(12) United States Patent
Cho

(10) Patent No.: US 11,848,159 B2
(45) Date of Patent: Dec. 19, 2023

(54) MULTILAYER CAPACITOR AND BOARD FOR MOUNTING THE SAME

(71) Applicant: SAMSUNG ELECTRO-MECHANICS CO., LTD., Suwon-si (KR)

(72) Inventor: Beom Joon Cho, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 34 days.

(21) Appl. No.: 17/337,924

(22) Filed: Jun. 3, 2021

(65) Prior Publication Data

US 2022/0139626 A1 May 5, 2022

(30) Foreign Application Priority Data

Nov. 4, 2020 (KR) .......................... 10-2020-0146190

(51) Int. Cl.
| | |
|---|---|
| *H01G 4/30* | (2006.01) |
| *H01G 4/232* | (2006.01) |
| *H05K 1/18* | (2006.01) |
| *H05K 1/11* | (2006.01) |
| *H01G 4/248* | (2006.01) |

(52) U.S. Cl.
CPC .......... *H01G 4/2325* (2013.01); *H01G 4/248* (2013.01); *H01G 4/30* (2013.01); *H05K 1/111* (2013.01); *H05K 1/181* (2013.01); *H05K 2201/10015* (2013.01)

(58) Field of Classification Search
CPC .................................................. H01G 4/2325
USPC ......................................................... 174/260
See application file for complete search history.

(56) References Cited

U.S. PATENT DOCUMENTS

| | | | |
|---|---|---|---|
| 2015/0162132 A1 | 6/2015 | Kwag et al. | |
| 2018/0151296 A1* | 5/2018 | Yamada | H01G 2/065 |
| 2018/0174753 A1* | 6/2018 | Terashita | H01G 4/008 |
| 2019/0237259 A1* | 8/2019 | Onodera | H01G 4/005 |
| 2019/0378654 A1* | 12/2019 | Yamada | H01G 4/232 |
| 2020/0211774 A1* | 7/2020 | Onodera | H01G 4/248 |

(Continued)

FOREIGN PATENT DOCUMENTS

| | | |
|---|---|---|
| JP | 2018-101724 A | 6/2018 |
| KR | 10-2004776 B1 | 7/2019 |

*Primary Examiner* — Stanley Tso
(74) *Attorney, Agent, or Firm* — MORGAN, LEWIS & BOCKIUS LLP

(57) ABSTRACT

A multilayer capacitor includes a capacitor body including a dielectric layer and a plurality of internal electrodes, and a pair of external electrodes disposed on opposing ends of the capacitor body and connected to exposed portions of the internal electrodes, wherein the external electrodes respectively include a conductive layer including a connection portion formed on one end surface of the capacitor body and connected to the internal electrode and a band portion extending from the connection portion to a portion of a neighboring surface of the capacitor body, a conductive resin layer covering a corner of the connection portion of the conductive layer and having a cutout portion so that a portion of an edge of the connection portion is exposed, and a plating layer covering the conductive layer and the conductive resin layer and contacting a portion of the conductive layer due to the cutout portion.

19 Claims, 9 Drawing Sheets

(56) References Cited

U.S. PATENT DOCUMENTS

2022/0068561 A1* 3/2022 Sasaki .................... H01G 4/232
2022/0122776 A1* 4/2022 Iguchi .................... H01G 4/248

* cited by examiner

MULTILAYER CAPACITOR AND BOARD FOR MOUNTING THE SAME

CROSS-REFERENCE TO RELATED APPLICATION(S)

This application claims the benefit of Korean Patent Application No. 10-2020-0146190, filed on Nov. 4, 2020 in the Korean Intellectual Property Office, the entire disclosure of which is incorporated herein by reference for all purposes.

TECHNICAL FIELD

The present disclosure relates to a multilayer capacitor and a board for mounting the same.

BACKGROUND

Multilayer capacitors, being compact and having high capacitance, have been used in various electronic devices.

In recent years, with the rapid rise of eco-friendly vehicles and electric vehicles, power driving systems in vehicles have increased, and accordingly, demand for multilayer capacitors required for vehicles has also increased.

Since automotive parts require a high level of thermal or electrical reliability, performance required for multilayer capacitors has also gradually increased.

In particular, there is a need for a structure of a multilayer capacitor having strong durability against external vibrations and deformation.

SUMMARY

Exemplary embodiments provide a multilayer capacitor having excellent durability against external vibrations and deformation, and a board for mounting the same.

According to an exemplary embodiment of the present disclosure, a multilayer capacitor may include: a capacitor body including a dielectric layer and a plurality of internal electrodes; and a pair of external electrodes disposed on opposing ends of the capacitor body and connected to exposed portions of the internal electrodes, wherein the external electrodes respectively include a conductive layer including a connection portion formed on one end surface of the capacitor body and connected to the internal electrode and a band portion extending from the connection portion to a portion of a neighboring surface of the capacitor body; a conductive resin layer covering a corner of the connection portion of the conductive layer and having a cutout portion so that a portion of an edge of the connection portion is exposed; and a plating layer covering the conductive layer and the conductive resin layer and contacting a portion of the conductive layer due to the cutout portion.

The cutout portion may be formed at the center of the conductive resin layer so that the center of the conductive layer is exposed.

The capacitor body may include first and second surfaces opposing each other in a first direction, third and fourth surfaces connecting the first and second surfaces and opposing each other in a second direction, and fifth and sixth surfaces connecting the first and second surfaces, connecting the third and fourth surfaces, and opposing each other in a third direction, wherein the internal electrodes include first and second internal electrodes exposed through the third and fourth surfaces, respectively.

The cutout portion may be formed to be elongated from the center of the conductive resin layer in the third direction to expose a portion of an edge of the conductive layer in contact with the fifth or sixth surface of the capacitor body.

The cutout portion may be formed to be elongated from the center of the conductive layer in the third direction to expose both a portion of an edge of the conductive layer in contact with the fifth surface of the capacitor body and a portion of an edge of the conductive layer in contact with the sixth surface of the capacitor body.

The cutout portion may be formed to be elongated from the center of the conductive resin layer in the first direction to expose a portion of an edge of the conductive layer in contact with the first or second surface of the capacitor body.

The cutout portion may be formed to be elongated from the center of the conductive layer in the first direction to expose both a portion of an edge of the conductive layer in contact with the first surface of the capacitor body and a portion of an edge of the conductive layer in contact with the second surface of the capacitor body.

The cutout portion may be formed to be elongated from the center of the conductive layer in the first direction to expose a portion of an edge of the conductive layer in contact with the first surface of the capacitor body and a portion of an edge of the conductive layer in contact with the second surface of the capacitor body, and may be formed to be elongated from the center of the conductive layer in the third direction to expose a portion of an edge of the conductive layer in contact with the fifth surface of the capacitor body and a portion of an edge of the conductive layer in contact with the sixth surface of the capacitor body.

The cutout portion may be formed to have a cross (+) shape when viewed from one cross-section of the capacitor.

The conductive resin layer may include metal powder particles and a resin.

The metal powder particles may have a spherical shape or a flake shape.

The plating layer may include a nickel plating layer covering the conductive layer and the conductive resin layer and a tin (Sn) plating layer covering the nickel plating layer.

According to an exemplary embodiment, a board for mounting a multilayer capacitor may include: a substrate having a pair of electrode pads disposed to be spaced apart from each other on one surface thereof; and the multilayer capacitor mounted on the pair of electrode pads so that the pair of the external electrodes are connected to the pair of electrode pads, respectively.

According to another exemplary embodiment of the present disclosure, a multilayer capacitor may include: a capacitor body including a dielectric layer and a plurality of internal electrodes; and a pair of external electrodes disposed on opposing ends of the capacitor body and connected to exposed portions of the plurality of internal electrodes. The pair of external electrodes each include: a conductive layer disposed on one end surface of the capacitor body; a conductive resin layer disposed to cover a portion of the conductive layer and having a cutout portion through which a portion of at least one edge of the conductive layer is exposed; and a plating layer disposed to cover the conductive layer and the conductive resin layer and contacting a portion of the conductive layer through the cutout portion.

According to still another exemplary embodiment of the present disclosure, a multilayer capacitor may include: a capacitor body including a dielectric layer and a plurality of internal electrodes; and a pair of external electrodes disposed on opposing ends of the capacitor body and connected to exposed portions of the plurality of internal electrodes. The pair of external electrodes each include: a conductive layer disposed on one end surface of the capacitor body; a conductive resin layer disposed to cover at least two corners among four corners of the conductive layer; and a plating layer disposed to cover the conductive layer and the conductive resin layer. Portions of the conductive resin layer respectively covering the at least two corners of the conductive layer are spaced apart from each other. A portion of an edge of the conductive layer is exposed through a space between said portions of the conductive resin layer respectively covering the at least two corners of the conductive layer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
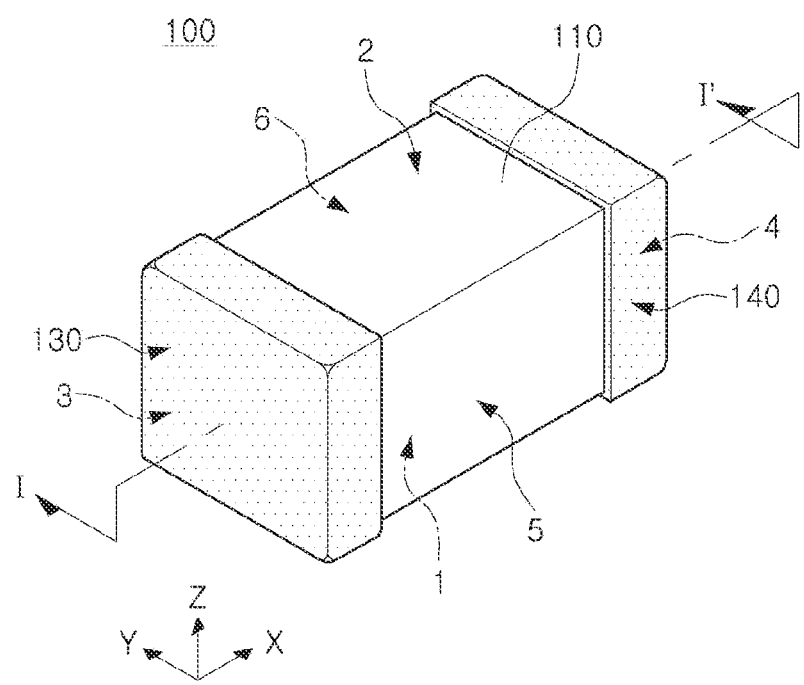
FIG. 1 is a schematic perspective view of a multilayer capacitor according to an exemplary embodiment in the present disclosure.

Exemplary embodiments of the present disclosure will now be described in detail with reference to the accompanying drawings.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least an example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

Hereinafter, to clarify an exemplary embodiment in the present disclosure, directions of the capacitor body 110 shown in the drawings are defined as follows: X, Y and Z represent a length direction, a width direction, and a thickness direction of a capacitor body 110, respectively.

Further, in this exemplary embodiment, the Z direction may be used to have the same concept as a stacking direction in which dielectric layers are stacked.

In addition, in this exemplary embodiment, the X, Y, and Z directions may be defined as second, third, and first directions, respectively.

Figure 2A:
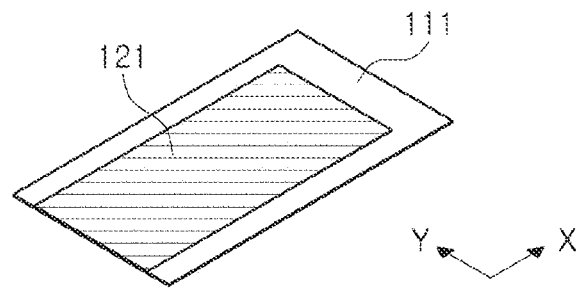
FIGS. 2A and 2B are exploded perspective views illustrating first and second internal electrodes applied to the multilayer capacitor of FIG. 1, respectively.
Figure 2B:
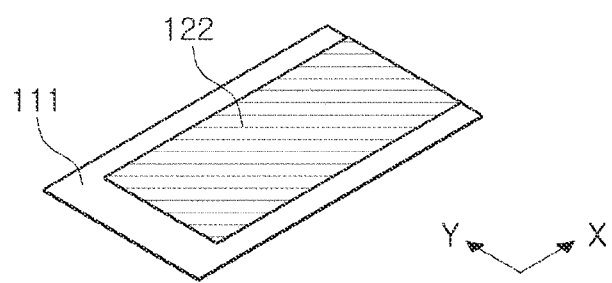
Figure 3:
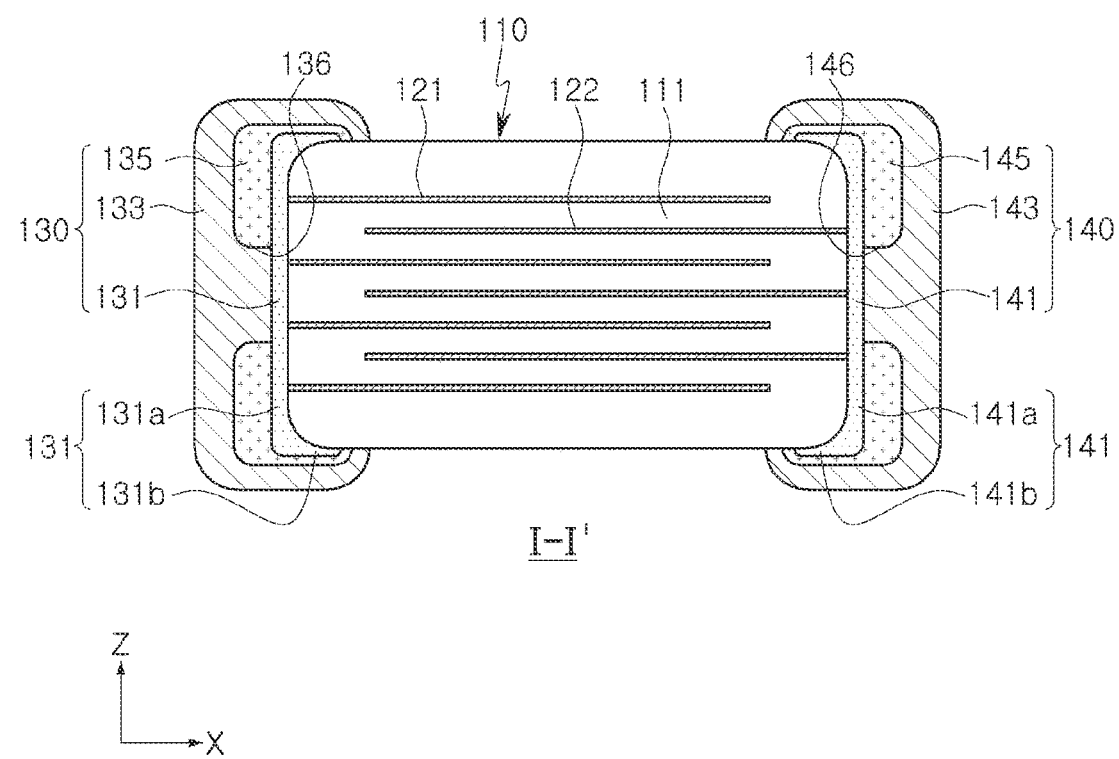
FIG. 3 is a cross-sectional view taken along line I-I' of FIG. 1.
Figure 4:
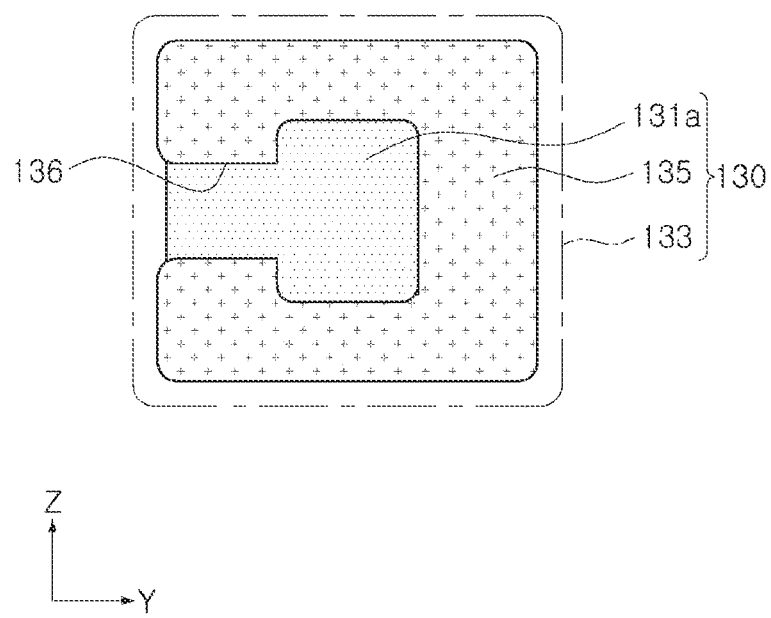
FIG. 4 is a side view illustrating a structure of a first external electrode in FIG. 1.

FIG. 1 is a schematic perspective view of a multilayer capacitor according to an exemplary embodiment in the present disclosure, FIGS. 2A and 2B are exploded perspective views illustrating first and second internal electrodes applied to the multilayer capacitor of FIG. 1, respectively. FIG. 3 is a cross-sectional view taken along line I-I' of FIG. 1, and FIG. 4 is a side view illustrating a structure of a first external electrode in FIG. 1.

Referring to FIGS. 1 through 4, a multilayer capacitor 100 according to the present exemplary embodiment includes a capacitor body 110 and first and second external electrodes 130 and 140.

The capacitor body 110 is obtained by stacking a plurality of dielectric layers 111 in the Z direction and then sintering the same, and adjacent dielectric layers 111 of the capacitor body 110 may be integrated such that boundaries therebetween may not be readily apparent without using a scanning electron microscope (SEM).

Here, the capacitor body 110 may have a substantially hexahedral shape, but the present disclosure is not limited thereto. Further, the shape and dimensions of the capacitor body 110 and the number of stacked dielectric layers 111 are not limited to those shown in the drawings of the present exemplary embodiment.

In this exemplary embodiment, for convenience of description, both surfaces of the capacitor body 110 opposing each other in the Z direction are defused as first and second surfaces 1 and 2, both surfaces connected to the first and second surfaces 1 and 2 and opposing each other in the X direction are defined as third and fourth surfaces 3 and 4, and both surfaces connected to the first and second surfaces 1 and 2, connected to the third and fourth surfaces 3 and 4, and opposing each other in the Y direction are defined as fifth and sixth surfaces 5 and 6.

In addition, in the present exemplary embodiment, a mounting surface of the multilayer capacitor 100 may be the first surface 1 of the capacitor body 110.

The dielectric layer 111 may include a ceramic material having a high dielectric constant and may include, for example, barium titanate ($BaTiO_3$)-based or strontium titanate ($SrTiO_3$)-based ceramic powder, etc., but the present disclosure is not limited thereto as long as sufficient capacitance may be obtained.

In addition, ceramic additives, organic solvents, plasticizers, binders and dispersants may be further added to the dielectric layer 111 along with the ceramic powder.

As the ceramic additives, for example, a transition metal oxide or a transition metal carbide, a rare earth element, magnesium (Mg), or aluminum (Al) may be used.

The capacitor body 110 may include an active region as a part contributing to the formation of capacitance of the capacitor and upper and lower covers 112 and 113 formed as upper and lower margins on the upper and lower surfaces of the active region in the Z direction, respectively.

The upper and lower covers 112 and 113 may have the same material and configuration as those of the dielectric layer 111, except that they do not include internal electrodes.

These upper and lower covers 112 and 113 may be formed by stacking a single dielectric layer or two or more dielectric layers on the upper and lower surfaces of the active region in the Z direction, respectively, and basically, serve to prevent damage to the first and second internal electrodes 121 and 122 due to physical or chemical stress.

The first and second internal electrodes 121 and 122 are electrodes to which different polarities are applied. The first and second internal electrodes 121 and 122 are alternately disposed along the Z direction with the dielectric layer 111 interposed therebetween and one ends thereof may be exposed through the third and fourth surfaces 3 and 4 of the capacitor body 110, respectively.

In this case, the first and second internal electrodes 121 and 122 may be electrically insulated from each other by the dielectric layer 111 disposed therebetween.

In this manner, the ends of the first and second internal electrodes 121 and 122 alternately exposed through the third and fourth surfaces 3 and 4 of the capacitor body 110 may be electrically connected to the first and second external electrodes 130 and 140 disposed on the third and fourth surfaces 3 and 4 of the capacitor body 110 to be described later, respectively.

According to the above configuration, when a predetermined voltage is applied to the first and second external electrodes 130 and 140, electric charges are accumulated between the first and second internal electrodes 121 and 122.

Here, capacitance of the multilayer capacitor 100 is proportional to an area of overlap of the first and second internal electrodes 121 and 122 overlapping each other along the Z direction in the active region.

In addition, a material for forming the first and second internal electrodes 121, 122 is not particularly limited and may be formed using a conductive paste including at least one of a noble metal material such as platinum (Pt), palladium (Pd), a palladium-silver (Pd—Ag) alloy, etc., nickel (Ni), and copper (Cu).

Here, as a printing method of the conductive paste, a screen printing method or a gravure printing method may be used but the present disclosure is not limited thereto.

The first and second external electrodes 130 and 140 may be provided with voltages of different polarities, may be disposed at both ends of the capacitor body 110 in the X direction, and may be electrically connected to exposed portions of the first and second internal electrodes 121 and 122.

Here, the first and second external electrodes 130 and 140 include first and second conductive layers 131 and 141 formed on a surface of the capacitor body 110 and connected to the first and second internal electrodes, first and second conductive resin layers 135 and 145 formed to cover the first and second conductive layers 131 and 141, respectively, and first and second plating layers 133 and 143 formed to cover the first and second conductive resin layers 135 and 145, respectively.

The first conductive layer 131 may include a first connection portion 131a and a first band portion 131b.

The first connection portion 131a is a portion formed on the third surface 3 of the capacitor body 110 and connected to the exposed portion of the first internal electrode 121, and the first band portion 131b is a portion extending from the first connection portion 131a to a portion of the first surface 1 of the capacitor body 110.

Here, the first band portion 131b may further extend to portions of the fifth and sixth surfaces 5 and 6 of the capacitor body 110 and a portion of the second surface 2 to improve the adhesion strength, etc.

The second conductive layer 141 may include a second connection portion 141a and a second band portion 141b.

The second connection portion 141a is a portion formed on the fourth surface 4 of the capacitor body 110 and connected to the exposed portion of the second internal electrode 122, and the second band portion 141b is a portion extending from the second connection portion 141a to a portion of the first surface 1 of the capacitor body 110.

Here, the second band portion 141b may further extend to portions of the fifth and sixth surfaces 5 and 6 of the capacitor body 110 and a portion of the second surface 2 of the capacitor body 110 to improve adhesion strength, etc.

These first and second conductive layers 131 and 141 are fired electrode layers and may include at least one of copper (Cu) and silver (Ag) and may further include glass, epoxy, etc. along therewith.

The first and second conductive resin layers 135 and 145 may be formed to cover the first and second conductive layers 131 and 141, respectively.

Here, the first conductive resin layer 135 may cover the corner of the first connection portion 131a of the first conductive layer 131 and have a first cutout portion to expose a portion of an edge of the first connection portion 131a.

In addition, the second conductive resin layer 145 may cover the corner of the second connection portion 141a of the second conductive layer 141 and have a second cutout portion 146 to expose a portion of an edge of the second connection portion 141a.

The first and second cutout portions 136 and 146 may be formed at the centers of the first and second conductive resin layers 135 and 145 so that the centers of the first and second connection portions 131a and 141a of the first and second conductive layers 131 and 141 may be exposed, respectively.

The first and second conductive resin layers 135 and 145 may include a plurality of metal powder particles and a resin surrounding the plurality of metal powder particles and contacting the first and second conductive layers 131 and 141, respectively.

Here, the resin may be one of polymer resins such as epoxy and acryl, but the present disclosure is not limited thereto.

In addition, the metal powder particles may be formed of at least one of Cu, Ag, and Sn or an alloy of two or more thereof, but the present disclosure is not limited thereto.

Also, the metal powder particles may be formed in a spherical or flake shape, but the present disclosure is not limited thereto.

FIG. 4 is a view illustrating the first plating layer 133 of the first external electrode 130 as being transparent in a direction facing the third surface of the capacitor body 110.

There is only a difference in that the first external electrode 130 is electrically connected to the first internal electrode 121 and the second external electrode 140 is connected to the second internal electrode 122, and configurations of the first external electrode 130 and the second external electrode 140 are substantially similar.

Therefore, hereinafter, a description will be made based on the first external electrode 130, but the description is considered to include a description of the second external electrode 140.

Referring to FIG. 4, the first conductive resin layer 135 covers four corners of the first connection portion 131a, and the first cutout portion 136 may be elongated from the center of the first conductive resin layer 135 toward the sixth surface 6 of the capacitor body 110 in the Y direction.

Accordingly, a portion of the edge of the first connection portion 131a in contact with the sixth surface 6 of the capacitor body 110 may be exposed by the first cutout portion 136.

Here, although not shown, on the contrary, the first cutout portion 136 may be elongated toward the fifth surface 5 of the capacitor body 110 in the Y direction, and in this case, a portion of the edge of the first connection portion 131a in contact with the fifth surface 5 of the capacitor body 110 may be exposed.

As another exemplary embodiment, although not shown, the first cutout portion may be formed to be elongated toward the first or second surface of the capacitor body in the Z direction, and in this case, a portion of the edge of the first connection portion of the first conductive layer in contact with the first or second surface may be exposed.

The first plating layer 133 may include a first nickel (Ni) plating layer covering the first conductive layer 131 and the first conductive resin layer 135 and a first tin (Sn) plating layer covering the first nickel (Ni) plating layer.

The second plating layer 143 may include a second nickel (Ni) plating layer covering the second conductive layer 141 and the second conductive resin layer 145 and a second tin (Sn) plating layer covering the second nickel (Ni) plating layer.

As a use environment of the multilayer capacitor becomes harsh, the related art multilayer capacitor is liable to crack due to vibration or mechanical deformation of a mounting board.

In order to prevent the occurrence of such cracks, a structure in which a conductive electrode layer including a resin having stretchability is formed on external electrodes to relieve stress from the outside has been disclosed.

Specifically, the structure includes an inner layer for electrically connecting the external electrode to the internal electrode and an outer conductive resin layer, mainly serving to alleviate external shock and improve moisture resistance, formed on the inner layer.

In particular, in the case of a multilayer capacitor for vehicle electric components, the conductive resin layer of the external electrode acts to alleviate a physical shock transmitted from the outside such as vibration.

However, the vehicle electric components are required to have higher durability against shock from the outside, but there are limitations to satisfying such a high level of durability with only the related art structure.

In addition, when the external electrode includes the conductive resin layer, resistance, in particular, equivalent series resistance (ESR), of the multilayer capacitor increases due to low electrical conductivity of the conductive resin layer itself.

In addition, since a coefficient of thermal expansion of the resin is relatively large, deterioration of an interface may appear near the conductive resin layer in a thermal shock environment such as a temperature cycle.

Therefore, a structure in which the conductive resin layer is formed only in a portion of the edge of the multilayer capacitor mounted on a board to prevent an increase in ESR while increasing durability against deformation of the board is disclosed.

However, with this structure, a chip orientation error may readily occur in a taping process during manufacturing because a mounting direction of the chip is determined as a specific direction which is ¼ of the entire sides, and the degree of freedom of the process decreases even during a board mounting operation.

The multilayer capacitor of this exemplary embodiment has a structure having a cutout portion so that a portion of the edge of the connection portion is exposed, while the conductive resin layer covers four corners of the connection portion of the conductive layer vulnerable to external shock.

According to this structure, durability of the multilayer capacitor against board warpage deformation may increase, and an increase in ESR of the multilayer capacitor may be prevented by allowing a portion of the conductive layer to be in direct contact with the plating layer due to the cutout portion.

In addition, since the conductive resin layer is formed on at least a portion of the four edges of the connection portion of the conductive layer, the multilayer capacitor may be mounted on the board, regardless of direction of the multilayer capacitor.

Figure 5:
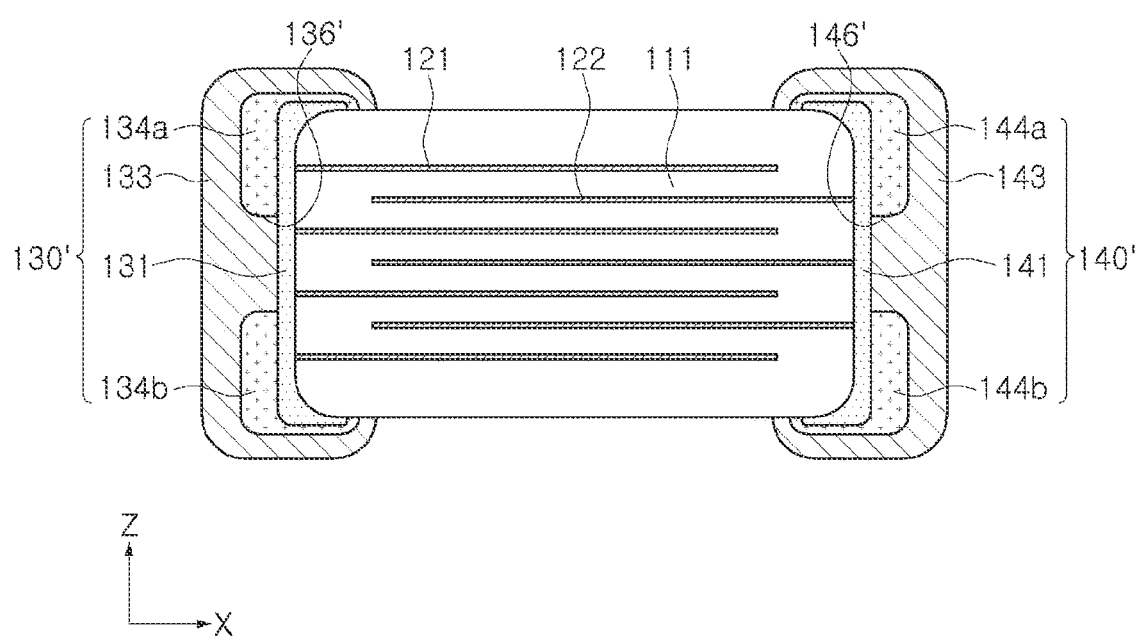
FIG. 5 is a cross-sectional view of a multilayer capacitor according to another exemplary embodiment in the present disclosure.
Figure 6:
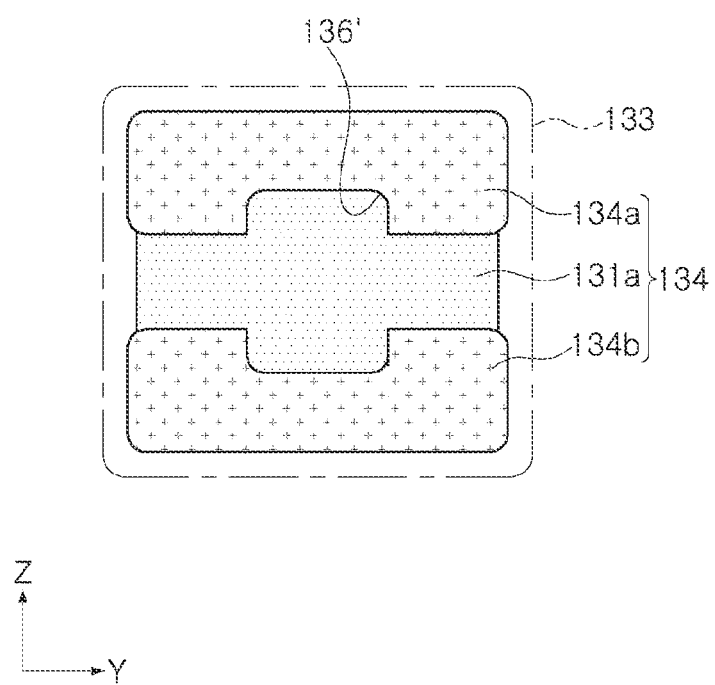
FIG. 6 is a side view illustrating a structure of a first external electrode in FIG. 5.

FIG. 5 is a cross-sectional view illustrating a multilayer capacitor according to another exemplary embodiment in the present disclosure, and FIG. 6 is a side view illustrating a first external electrode in FIG. 5.

Hereinafter, a description will be made based on a first external electrode 130', but it is considered to include a description of a second external electrode 140'.

In FIG. 5, reference numerals 144a and 144b denote a second conductive resin layer 144 of the second external electrode 140', and reference numeral 146' denotes a second cutout portion.

Referring to FIGS. 5 and 6, a first cutout portion 136' of the first conductive resin layer 130' is formed to be elongated from the center of the first conductive resin layer 134 toward the left and right sides in the Y direction so that both a portion of the edge of the first connection portion 131a of the first conductive layer 131 in contact with the fifth surface 5 of the capacitor body 110 and a portion of the edge of the first connection portion 131a of the first conductive layer 131 in contact with the sixth surface 6 of the capacitor body 110 are exposed.

Here, the first conductive resin layer 134 may be divided into an upper (1-1)th conductive resin layer 134a and a lower (1-2)th conductive resin layer 134b due to the first cutout portion 136'.

As another example, although not shown, the first cutout portion may be formed to be elongated upwardly and downwardly in the Z direction so that a portion of the edge of the first conductive layer in contact with the first surface of the capacitor body and a portion of the edge of the first conductive layer in contact with the second surface of the capacitor body may be exposed.

Figure 7:
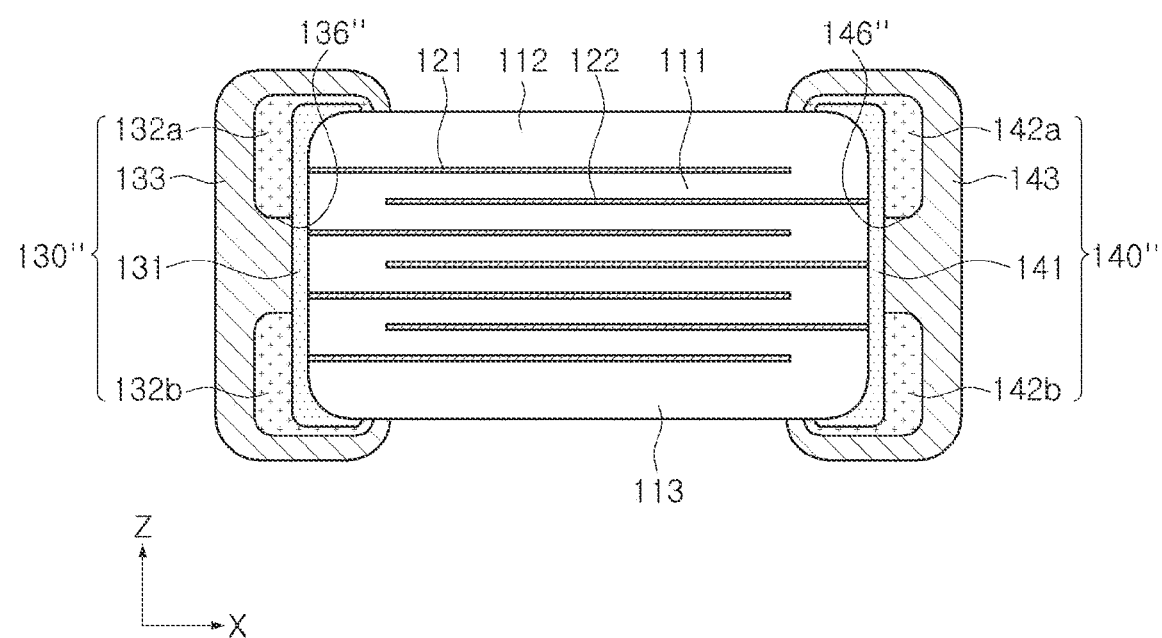
FIG. 7 is a cross-sectional view of a multilayer capacitor according to another exemplary embodiment in the present disclosure.
Figure 8:
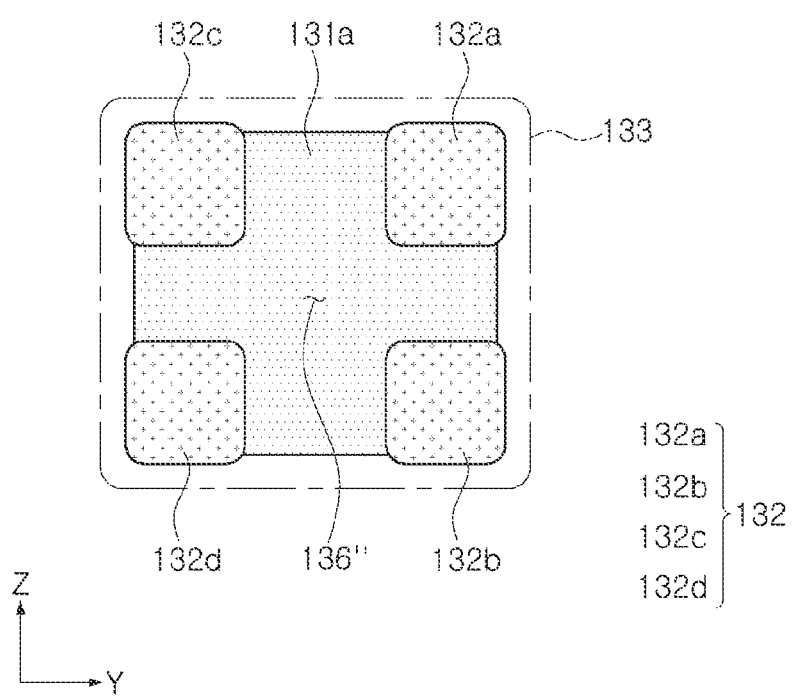
FIG. 8 is a side view illustrating a first external electrode in FIG. 7.

FIG. 7 is a cross-sectional view illustrating a multilayer capacitor according to another exemplary embodiment in the present disclosure, and FIG. 8 is a side view illustrating a first external electrode in FIG. 7.

Hereinafter, a description will be made based on the first external electrode 130, but it is considered to include a description of the second external electrode 140.

In FIG. 7, reference numerals 142a and 142b denote a second conductive resin layer 142 of a second external electrode 140", and reference numeral 146" denotes a second cutout portion.

Referring to FIGS. 7 and 8, a first cutout portion 136" may be formed to be elongated from the center of a first conductive resin layer 132 to the left and right in the Y direction so that both a portion of the edge of the first connection portion 131a of the first conductive layer 131 in contact with the fifth surface 5 of the capacitor body 110 and a portion of the edge of the first connection portion 131a of the first conductive layer 131 in contact with the sixth surface 6 of the capacitor body 110 may be exposed.

In addition, the first cutout portion 136" may be formed to be elongated from the center of the first conductive resin layer 132 upwardly and downwardly in the Z direction so that both a portion of the edge of the first connection portion 131a of the first conductive layer 131 in contact with the first surface 1 of the capacitor body 110 and a portion of the edge of the first connection portion 131a of the first conductive layer 131 in contact with the second surface 2 of the capacitor body 110 may be additionally exposed.

Here, in the first cutout portion 136", a portion formed to be elongated from the center of the first conductive resin layer 132 in the Y direction and a portion formed to be elongated in the Z direction may be connected to each other, and thus, the first cutout portion 136" may be formed to have a cross (+) shape overall, when viewed from a direction facing the third surface 3 of the capacitor body 110.

Here, as the first conductive resin layer 132, covering four corners of the first connection portion of the first conductive layer due to the first cutout portion 136", may be divided into four conductive resin layers 132a, 132b, 132c, and 132d spaced apart from each other.

Figure 9:
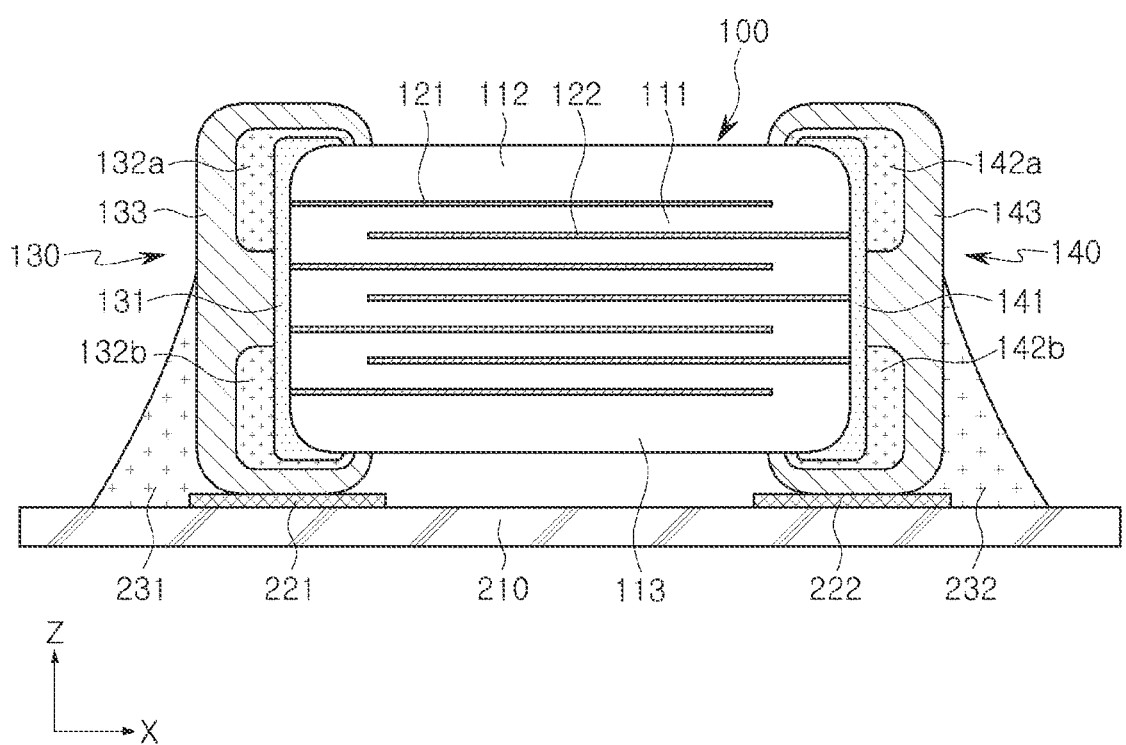
FIG. 9 is a schematic cross-sectional view illustrating the multilayer capacitor of FIG. 7 mounted on a substrate.

FIG. 9 is a schematic cross-sectional view illustrating the multilayer capacitor of FIG. 7 mounted on a substrate.

Referring to FIG. 9, a mounting board of a multilayer capacitor according to the present exemplary embodiment includes a substrate 210 having first and second electrode pads 221 and 222 disposed to be spaced apart from each other on a surface thereof and a multilayer capacitor 100 mounted on an upper surface of the substrate 210 such that the first and second external electrodes 130 and 140 are mounted on first and second electrode pads 221 and 222, respectively.

FIG. 9 illustrates that a multilayer capacitor having the structure of FIG. 7 is mounted on a substrate, but the present disclosure is not limited thereto. For example, a multilayer capacitor having the structure of FIG. 3 or 5 may be mounted on the mounting board.

In addition, in this exemplary embodiment, the multilayer capacitor 100 is described as being bonded to and mounted with the first and second electrode pads 221 and 222 of the substrate 210 by solders 231 and 232, but, if necessary, a conductive paste may be used instead of solder.

As set forth above, according to an exemplary embodiment, the conductive resin layer of the external electrode has the cutout portion to expose a portion of the edge of the conductive layer, so that a portion of the conductive layer may be in direct contact with the plating layer, thereby improving durability against warpage deformation of the multilayer capacitor and preventing an increase in ESR.

While exemplary embodiments have been shown and described above, it will be apparent to those skilled in the art that modifications and variations could be made without departing from the scope of the present disclosure as defined by the appended claims.

What is claimed is:

1. A multilayer capacitor comprising:
   a capacitor body including a dielectric layer and a plurality of internal electrodes; and
   a pair of external electrodes disposed on opposing ends of the capacitor body and connected to exposed portions of the plurality of internal electrodes,
   wherein the pair of external electrodes each include:

a conductive layer including a connection portion disposed on one end surface of the capacitor body and connected to a portion of the plurality of internal electrodes, and a band portion extending from the connection portion onto a portion of a neighboring surface of the capacitor body;

a conductive resin layer disposed to cover a corner of the connection portion of the conductive layer and having a cutout portion through which a portion of an edge of the conductive layer at which the band portion extends from the connection portion is exposed; and a plating layer disposed to cover the conductive layer and the conductive resin layer and contacting a portion of the conductive layer through the cutout portion, wherein the cutout portion extends to an outermost boundary of the conductive resin layer in a direction parallel to the one end surface, wherein the cutout portion is located at a center of the conductive resin layer so that a center of the conductive layer is exposed, wherein the cutout portion extends to be elongated from the center of the conductive resin layer such that a portion of a first edge of the conductive layer or a portion of a second edge of the conductive layer is exposed to be in contact with the plating layer, the first and second edges of the conductive layer opposing each other, and wherein a length of the exposed portion of the first or second edge of the conductive layer is smaller than a length of the cutout portion located at the center of the conductive resin layer.

2. The multilayer capacitor of claim 1, wherein the capacitor body includes first and second surfaces opposing each other in a first direction, third and fourth surfaces connecting the first and second surfaces to each other and opposing each other in a second direction, and fifth and sixth surfaces connecting the first and second surfaces, connecting the third and fourth surfaces to each other and opposing each other in a third direction, and wherein the plurality of internal electrodes include first and second internal electrodes exposed through the third and fourth surfaces, respectively.

3. The multilayer capacitor of claim 2, wherein the cutout portion extends in the third direction to expose the portion of the first or second edge of the conductive layer respectively in contact with the fifth or sixth surface of the capacitor body.

4. The multilayer capacitor of claim 2, wherein the cutout portion extends in the third direction to expose both the portion of the first edge of the conductive layer in contact with the fifth surface of the capacitor body and the portion of the second edge of the conductive layer in contact with the sixth surface of the capacitor body.

5. The multilayer capacitor of claim 2, wherein the cutout portion extends in the first direction to expose a portion of an edge of the conductive layer in contact with the first or second surface of the capacitor body.

6. The multilayer capacitor of claim 2, wherein the cutout portion extends in the first direction to expose both a portion of an edge of the conductive layer in contact with the first surface of the capacitor body and a portion of an edge of the conductive layer in contact with the second surface of the capacitor body.

7. The multilayer capacitor of claim 2, wherein the cutout portion extends in the first direction to expose a portion of an edge of the conductive layer in contact with the first surface of the capacitor body and a portion of an edge of the conductive layer in contact with the second surface of the capacitor body, and the cutout portion extends in the third direction to expose both the portion of the first edge of the conductive layer in contact with the fifth surface of the capacitor body and the portion of the second edge of the conductive layer in contact with the sixth surface of the capacitor body.

8. The multilayer capacitor of claim 2, wherein the cutout portion extends to have a cross (+) shape when viewed from one cross-section of the capacitor.

9. The multilayer capacitor of claim 1, wherein the conductive resin layer includes metal powder particles and a resin.

10. The multilayer capacitor of claim 9, wherein the metal powder particles have a spherical shape or a flake shape.

11. The multilayer capacitor of claim 1, wherein the plating layer includes a nickel plating layer covering the conductive layer and the conductive resin layer and a tin (Sn) plating layer covering the nickel plating layer.

12. A board for mounting a multilayer capacitor comprising:

a substrate having a pair of electrode pads disposed to be spaced apart from each other on one surface of the substrate; and the multilayer capacitor of claim 1 mounted on the pair of electrode pads, wherein the pair of the external electrodes are connected to the pair of electrode pads, respectively.

13. The multilayer capacitor of claim 1, wherein the dielectric layer and plurality of internal electrodes are arranged in a stacking direction, and wherein the cutout portion includes a first portion and a second portion each linearly extending in a width direction of the capacitor body, the first portion having a length in the stacking direction which is greater than a length of the second portion in the stacking direction.

14. A multilayer capacitor comprising:

a capacitor body including a dielectric layer and a plurality of internal electrodes; and a pair of external electrodes disposed on opposing ends of the capacitor body and connected to exposed portions of the plurality of internal electrodes, wherein the pair of external electrodes each include:

a conductive layer disposed on one end surface of the capacitor body;

a conductive resin layer disposed to cover a portion of the conductive layer and having a cutout portion through which a portion of at least one outer edge of the conductive layer disposed on the one end surface is exposed; and a plating layer disposed to cover the conductive layer and the conductive resin layer and contacting a portion of the conductive layer through the cutout portion, wherein the cutout portion extends to an outermost boundary of the conductive resin layer in a direction parallel to the one end surface, wherein the cutout portion is located at a center of the conductive resin layer so that a center of the conductive layer is exposed, wherein the cutout portion extends to be elongated from the center of the conductive resin layer such that a portion of a first edge of the conductive layer or a portion of a second edge of the conductive layer is exposed to be in contact with the plating layer, the first and second edges of the conductive layer opposing each other, and wherein a length of the exposed portion of the first or second edge of the conductive layer is smaller than a length of the cutout portion located at the center of the conductive resin layer.

15. The multilayer capacitor of claim 14, wherein the cutout portion extends such that a portion of each of the first and second edges, and a portion of each of a third and fourth edge, of the conductive layer is exposed to be in contact with the plating layer.

16. The multilayer capacitor of claim 14, wherein each conductive layer includes a connection portion disposed on the one end surface of the capacitor body and connected to a portion of the plurality of internal electrodes, and a band portion extending from the connection portion onto a portion of a neighboring surface of the capacitor body connected to the one end surface of the capacitor body.

17. The multilayer capacitor of claim 16, wherein the conductive resin layer extends along an outer surface of the band portion to be in contact with the neighboring surface of the capacitor body, and the plating layer extends along an outer surface of the conductive resin layer to be in contact with the neighboring surface of the capacitor body.

18. The multilayer capacitor of claim 14, wherein the dielectric layer and plurality of internal electrodes are arranged in a stacking direction, and wherein the cutout portion includes a first portion and a second portion each linearly extending in a width direction of the capacitor body, the first portion having a length in the stacking direction which is greater than a length of the second portion in the stacking direction.

19. A multilayer capacitor comprising:

a capacitor body including a dielectric layer and a plurality of internal electrodes; and a pair of external electrodes disposed on opposing ends of the capacitor body and connected to exposed portions of the plurality of internal electrodes, wherein the pair of external electrodes each include:

a conductive layer disposed on one end surface of the capacitor body;

a conductive resin layer disposed to cover at least two corners among four corners of the conductive layer; and a plating layer disposed to cover the conductive layer and the conductive resin layer, wherein portions of the conductive resin layer respectively covering the at least two corners of the conductive layer are physically isolated from each other, wherein a portion of an outer edge of the conductive layer disposed on the one end surface is exposed through a space between said portions of the conductive resin layer respectively covering the at least two corners of the conductive layer, wherein a cutout portion is located at a center of the conductive resin layer so that a center of the conductive layer is exposed, wherein the cutout portion extends to be elongated from the center of the conductive resin layer such that a portion of a first edge of the conductive layer or a portion of a second edge of the conductive layer is exposed to be in contact with the plating layer, the first and second edges of the conductive layer opposing each other, and wherein a length of the exposed portion of the first or second edge of the conductive layer is smaller than a length of the cutout portion located at the center of the conductive resin layer.

* * * * *